(12) United States Patent
Hsiao

(10) Patent No.: US 7,059,871 B1
(45) Date of Patent: Jun. 13, 2006

(54) MEMORY CARD CASING HAVING LONGITUDINALLY FORMED RIDGES AND RADIALLY FORMED RIBS FOR SUPPORT OF CONTACTS OF A PCB

(75) Inventor: Kun-Hsien Hsiao, Chung Ho (TW)

(73) Assignee: Chip Hope Co., Ltd., Taipei Hsien (TW)

(*) Notice: Subject to any disclaimer, the term of this patent is extended or adjusted under 35 U.S.C. 154(b) by 0 days.

(21) Appl. No.: 11/009,064

(22) Filed: Dec. 13, 2004

(51) Int. Cl.
*H01R 12/00* (2006.01)

(52) U.S. Cl. ............ 439/76.1; 439/946; 361/737; 361/736; 235/492; 235/441

(58) Field of Classification Search ............ 439/76.1, 439/945, 946; 361/737, 736; 235/492, 441
See application file for complete search history.

(56) References Cited

U.S. PATENT DOCUMENTS

| | | | |
|---|---|---|---|
| 5,173,841 A * | 12/1992 | Uenaka et al. | 361/758 |
| 6,333,854 B1 * | 12/2001 | Sasaoka et al. | 361/737 |
| 6,370,028 B1 * | 4/2002 | Seeley et al. | 361/737 |
| 6,381,143 B1 * | 4/2002 | Nakamura | 361/737 |
| 6,616,053 B1 * | 9/2003 | Kondo et al. | 235/492 |
| 6,761,320 B1 * | 7/2004 | Chen | 235/492 |
| 6,783,076 B1 * | 8/2004 | Kondo et al. | 235/492 |
| 6,805,585 B1 * | 10/2004 | Ko | 439/607 |

* cited by examiner

*Primary Examiner*—Gary F. Paumen
(74) *Attorney, Agent, or Firm*—Rosenberg, Klein & Lee

(57) ABSTRACT

A memory card casing is composed of a top cover having multiple through holes defined in a peripheral edge of the top cover, and a bottom cover, wherein the bottom cover has multiple longitudinal ridges formed on a peripheral edge of the bottom cover, a first rib formed on the bottom cover to connect to one end of each of the longitudinal ridges and a second rib formed on the bottom cover to connect to the other end of each of the longitudinal ridges so that after a printed circuit board is inserted into a receiving space between the bottom cover and the top cover, contacts on the printed circuit board are exposed via the through holes of the top cover and fully supported by the longitudinal ridges.

2 Claims, 4 Drawing Sheets

US 7,059,871 B1

MEMORY CARD CASING HAVING LONGITUDINALLY FORMED RIDGES AND RADIALLY FORMED RIBS FOR SUPPORT OF CONTACTS OF A PCB

BACKGROUND OF THE INVENTION

1. Field of the Invention

The present invention relates to a memory card casing, and more particularly to memory card casing having ridges and ribs formed on a bottom cover of the casing so as to provide sufficient force to support thereon contacts of a printed circuit board.

2. Description of Related Art

Digital cameras and other electronic devices such as cell phones depend on memory cards to store valuable information. According to their information storing capabilities, memory cards for storing large quantity of information may be divided into an SD (secure digital) card and an XD (extreme digital) card. However, because the thickness of the printed circuit board (PCB) of the memory card is reduced to less than 0.3 mm and respective thickness for the top cover and the bottom cover of the casing for receiving therein the PCB is less than 0.2 mm, the rigidness of the memory card is not sufficient. That is, the memory card is easily distorted and damaged especially when inserted into the receiving port of an electronic device. Moreover, the PCB normally has multiple contacts extending out of the casing for engagement with legs extending from the receiving port of the electronic device. Under the situation that there is no sufficient support to the contacts, the contacts are easily damaged when engaging with the legs of the electronic device.

With reference to FIG. 1, a conventional memory card casing is shown and composed of a top casing (1) and a bottom casing (2). The top casing (1) has multiple openings (11) defined in a peripheral edge of the top casing (1) for exposing contacts on a PCB. In order to support and sandwich the PCB with the top casing (1), the bottom cover (2) has multiple columns (21) and ears (22) formed on a peripheral edge of the bottom cover (2) to correspond to a space between two adjacent openings (11) such that the columns (21) and the ears (22) are able to support the contacts of the PCB after the PCB is sandwiched between the combination of the top cover (1) and the bottom cover (2). Because the support from the columns (21) and ears (22) can only provide little support rigidness to the PCB contacts, the contacts are still easily damaged and distorted when inserted into the receiving port of an electronic device.

To overcome the shortcomings, the present invention tends to provide an improved memory card casing to mitigate the aforementioned problems.

SUMMARY OF THE INVENTION

The primary objective of the present invention is to provide an improved memory card casing to provide sufficient support for PCB contacts such that chance of damage to the PCB contacts is reduced.

In order to accomplish the aforementioned objective, the memory card casing is composed of a top cover and a bottom cover. The bottom cover has multiple longitudinally formed ridges and radially formed ribs on a face of the bottom cover so that after the printed circuit board is inserted between the bottom cover and the top cover, the contacts are entirely supported by the ridges and ribs and therefore damage to the PCB contacts when the memory card is inserted into the electronic device is avoided.

Other objects, advantages and novel features of the invention will become more apparent from the following detailed description when taken in conjunction with the accompanying drawings.

DETAILED DESCRIPTION OF THE PREFERRED EMBODIMENT

Figure 1:
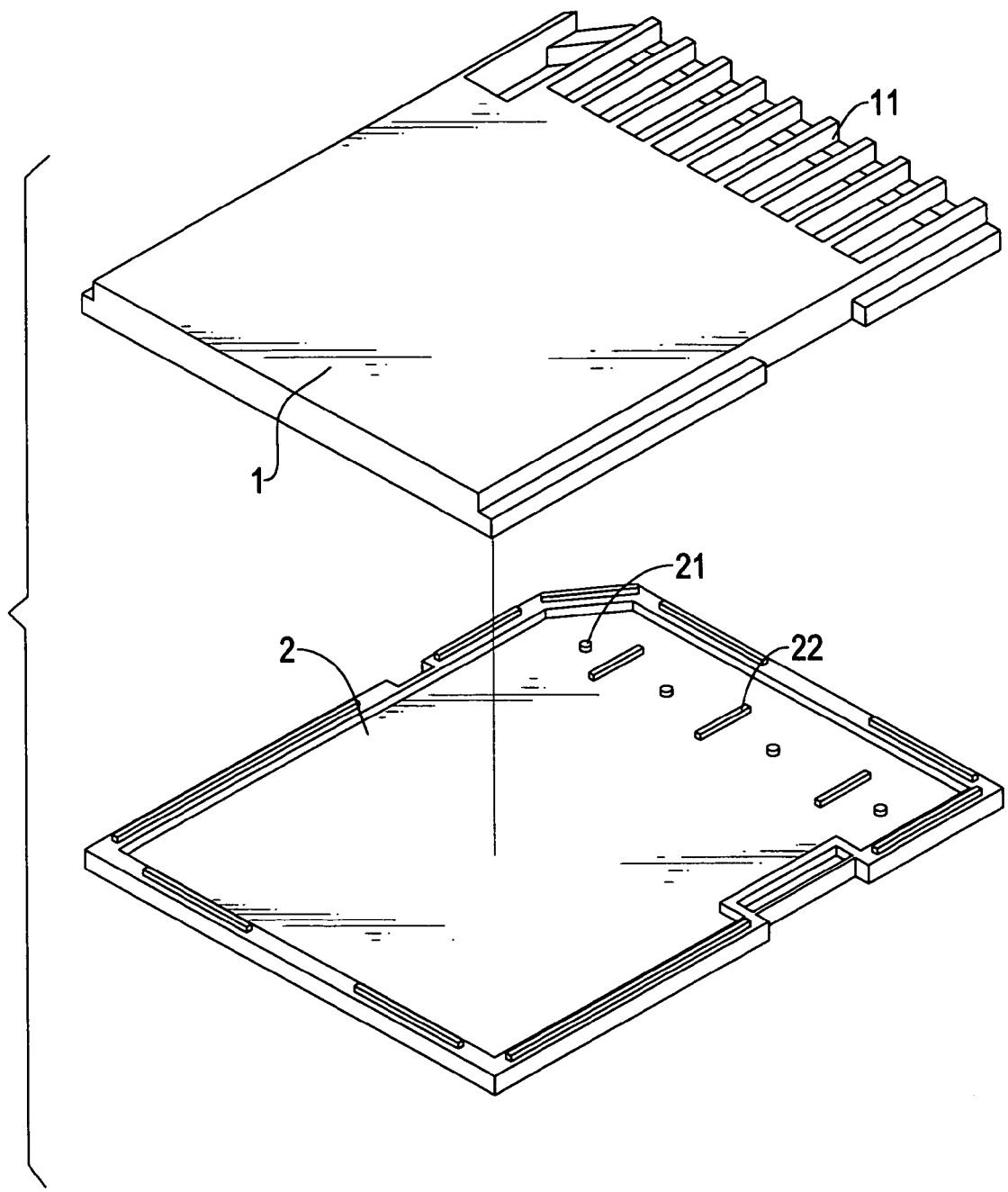
FIG. 1 is a perspective view showing a conventional memory card casing, wherein the top casing is reversed to show the inner structure of the top casing and a top face of the bottom casing is orientated out of the drawing paper.
Figure 2A:
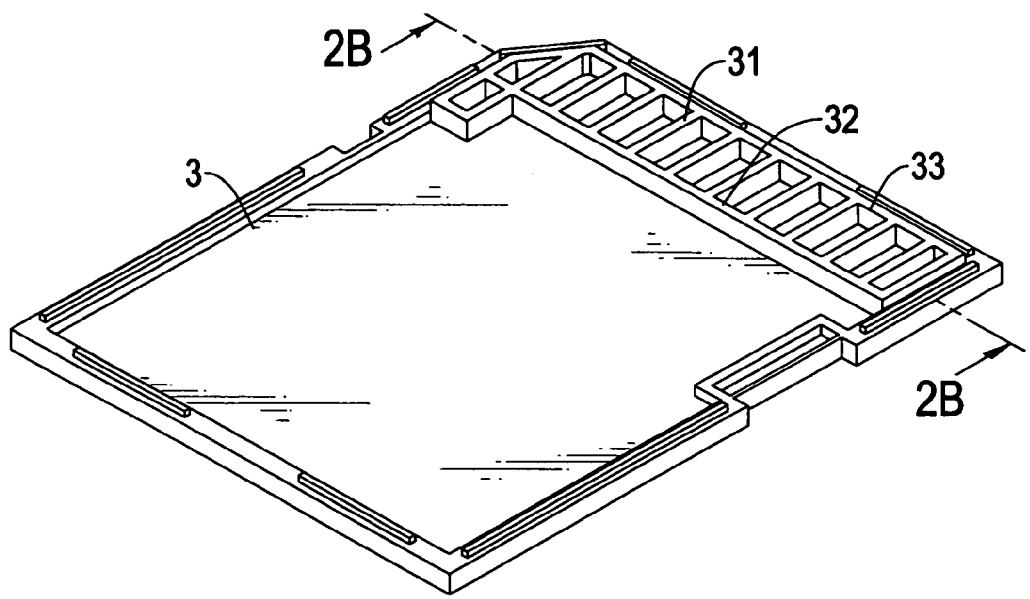
FIG. 2A is a perspective view of the bottom cover with the bottom cover reversed.
Figure 2B:
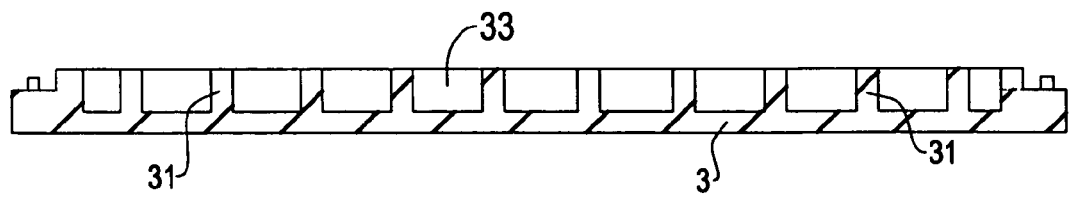
FIG. 2B is a cross sectional view of the bottom cover taken from the line 2B—2B in FIG. 2A.

With reference to FIGS. 2A and 2B, the memory card casing is composed of a top cover (not shown) and a bottom cover (3) together with the top cover to form a receiving space for receiving therebetween a printed circuit board (PCB). The top cover has a configuration the same as that of the conventional memory card casing so that detailed description thereof is omitted.

It is noted that the bottom cover (3) has multiple longitudinal ridges (31) formed at a peripheral edge of the bottom cover (3), a first rib (32) formed on the bottom cover (3) to connect to one end of each of the longitudinal ridges (31) and a second rib (33) formed on the bottom cover (3) to connect to the other end of each of the longitudinal ridges (31) such that a rigid support is formed on the bottom cover (3) for supporting thereon contacts of the PCB. Preferably, the quantity of the longitudinal ridges is no bigger than three (3) to avoid possibility of deformation from contraction out of cold in the manufacturing process.

Figure 3:
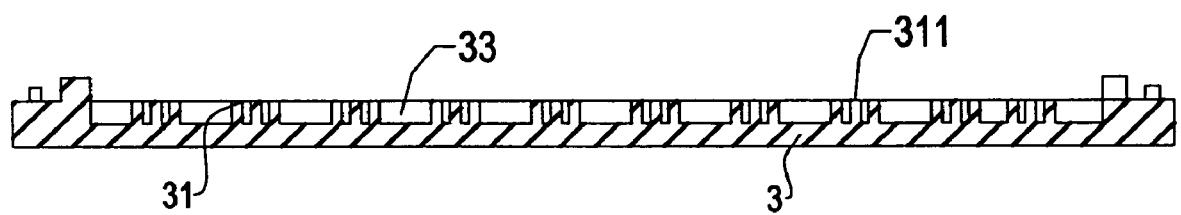
FIG. 3 is a cross sectional view of the bottom cover showing a different embodiment of the present invention.

With reference to FIG. 3, each ridge (31) of the bottom cover (3) may be composed of two or three raised portions (311). The quantity of the raised portions is no greater than the numeral 3.

Figure 4:
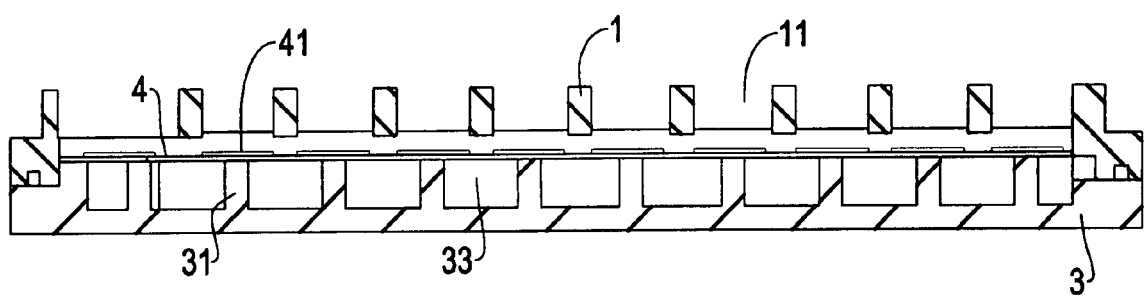
FIG. 4 is a cross sectional view showing the combination of the memory card casing with the printed circuit board.

With reference to FIG. 4, it is noted that the memory card casing is assembled and has the top cover (1) and the bottom cover (3). A receiving space is defined between the top cover (1) and the bottom cover (3) for receiving therein the PCB (4). The bottom cover (3) has integrated circuits formed on a top face of the bottom cover (3) for connection to contacts (41) of the PCB (4). Further, it is noted that the contacts (41) are securely supported by the ridges (31).

The first rib (32) and the second rib (33) are to reinforce the rigidness of the bottom cover (3) so that when the memory card is inserted into any suitable electronic device, the memory card casing is not easily damaged.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A memory card casing comprising a top cover having multiple through holes defined in a peripheral edge of the top cover, and a bottom cover, wherein the bottom cover has multiple longitudinal ridges formed on a peripheral edge of the bottom cover, a first rib raised above a bottom surface of the bottom cover to connect to one end of each of the longitudinal ridges and a second rib raised above the bottom surface of the bottom cover to connect to another end of each of the longitudinal ridges, the longitudinal ridges being flush with the first and second ribs so that after a printed circuit board is inserted into a receiving space between the bottom cover and the top cover, and contacts on the printed circuit board are exposed via the through holes of the top cover and fully supported by the longitudinal ridges.

2. The memory card casing as claimed in claim 1, wherein each ridge is composed of multiple raised portions and a quantity of the raised portions is no greater than three.

* * * * *